United States Patent
Kovats et al.

(10) Patent No.: US 6,376,914 B2
(45) Date of Patent: *Apr. 23, 2002

(54) DUAL-DIE INTEGRATED CIRCUIT PACKAGE

(75) Inventors: Julius A. Kovats, Manitou Springs; Ken M. Lam, Colorado Springs, both of CO (US)

(73) Assignee: Atmel Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/458,264

(22) Filed: Dec. 9, 1999

(51) Int. Cl.$^7$ .................. H01L 23/52; H01L 25/065; H01L 25/07; H01L 25/18; H01L 29/40
(52) U.S. Cl. .................. 257/777; 257/686; 257/685; 257/723; 257/797; 257/730; 257/738; 257/778; 257/734; 257/666; 257/781; 257/737; 365/63; 365/52
(58) Field of Search .................. 257/777–781, 257/772, 734, 737, 738, 723, 730, 686, 685, 666, 676, 797; 365/63, 52

(56) References Cited

U.S. PATENT DOCUMENTS

| 5,229,960 A | | 7/1993 | De Givry .................. 365/63 |
|---|---|---|---|
| 5,596,225 A | * | 1/1997 | Mathew et al. .................. 257/777 |
| 5,640,044 A | * | 6/1997 | Takehashi et al. .................. 257/666 |
| 5,721,452 A | | 2/1998 | Fogal et al. .................. 257/685 |
| 5,760,478 A | * | 6/1998 | Bozso et al. .................. 257/777 |
| 5,901,043 A | * | 5/1999 | Lin et al. .................. 257/777 |
| 5,923,090 A | * | 7/1999 | Fallon et al. .................. 257/777 |
| 5,952,725 A | * | 9/1999 | Ball .................. 257/777 |
| 5,973,403 A | * | 10/1999 | Wark .................. 257/777 |
| 6,005,778 A | * | 12/1999 | Spielberger et al. .................. 257/777 |
| 6,030,885 A | * | 2/2000 | Bothra .................. 438/460 |
| 6,051,886 A | * | 4/2000 | Fogal et al. .................. 257/777 |
| 6,057,598 A | * | 5/2000 | Payne et al. .................. 257/777 |
| 6,091,138 A | * | 7/2000 | Yu et al. .................. 257/686 |
| 6,104,084 A | * | 8/2000 | Ishio et al. .................. 257/666 |
| 6,118,470 A | * | 9/2000 | Radford et al. .................. 257/723 |
| 6,133,637 A | * | 10/2000 | Hikita et al. .................. 257/777 |
| 6,175,157 B1 | * | 1/2001 | Morifuji .................. 257/777 |
| 6,208,579 B1 | * | 3/2001 | Prutchi et al. .................. 365/230.01 |

FOREIGN PATENT DOCUMENTS

| EP | 0 890 989 A1 | 1/1999 |
|---|---|---|
| JP | 61287133 | 12/1986 |
| JP | 04155954 | 5/1992 |
| JP | 05129516 | 5/1993 |

* cited by examiner

Primary Examiner—Alexander O. Williams
(74) Attorney, Agent, or Firm—Thomas Schneck; John P. McGuire, Jr.

(57) ABSTRACT

A diual-die integrated circuit package having two integrated circuit chips "flip chip" attached to each other and with one of the chips being aligned at a specified angle in relation to the other chip to allow access to bonding pads on the surface of each chip for wirebonding connection into the chip package. In a first embodiment, the two chips are rectangular in shape and are aligned at an angle of 90 degrees with respect to each other, thus allowing the end portions of the bottom chip to be accessible for connection into the chip package. Other embodiments maintain the chips at angles of less than 90 degrees, such that corner portions of each chip are accessible for connection into the chip package. The invention allows two identically constructed chips to be used for doubling or even greater multiplication of the functionality or memory of the IC package, while still using the same package footprint as for a single chip. Also, being able to use two chips that are identically constructed from a wafer fabrication standpoint provides the advantage of requiring only one IC design process.

23 Claims, 4 Drawing Sheets

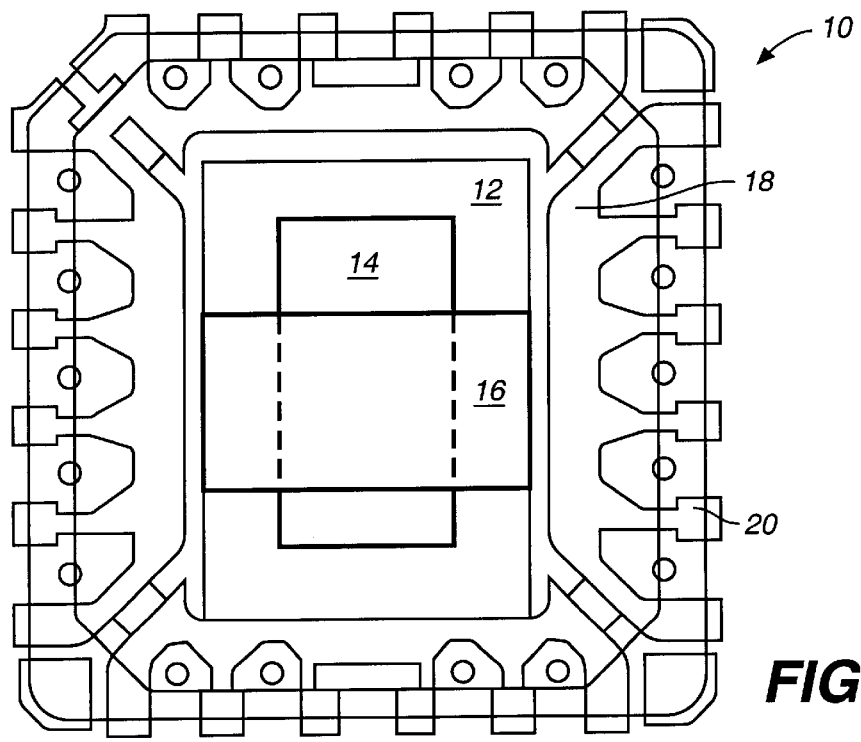
FIG._1
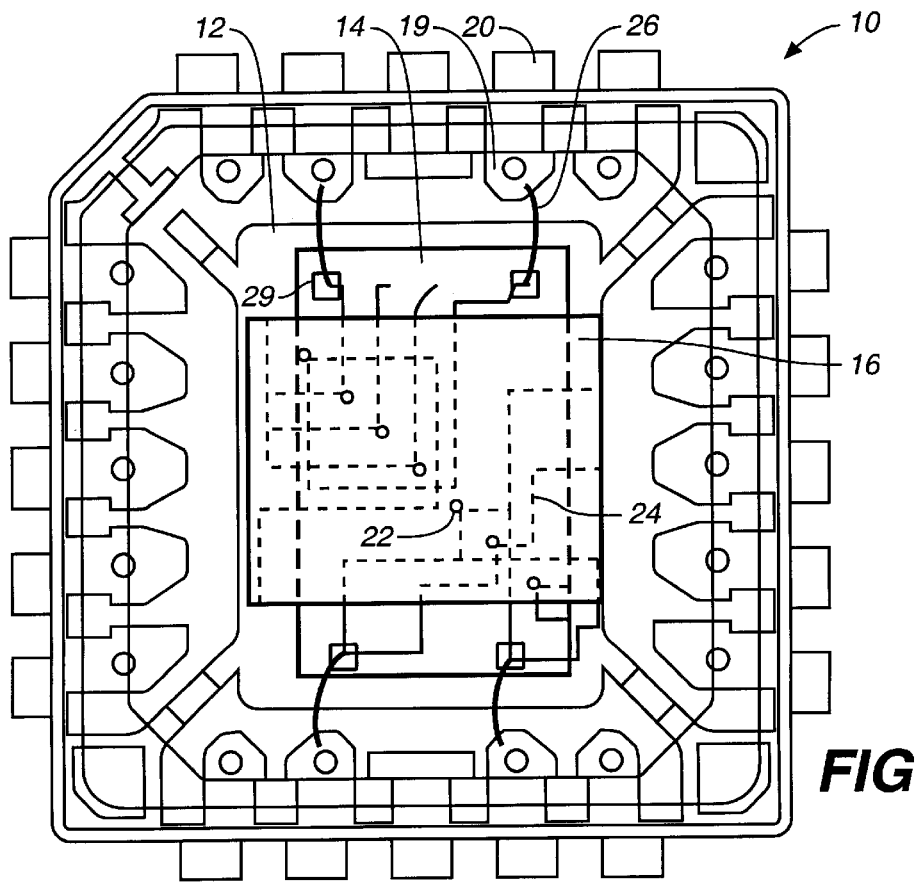
FIG._3

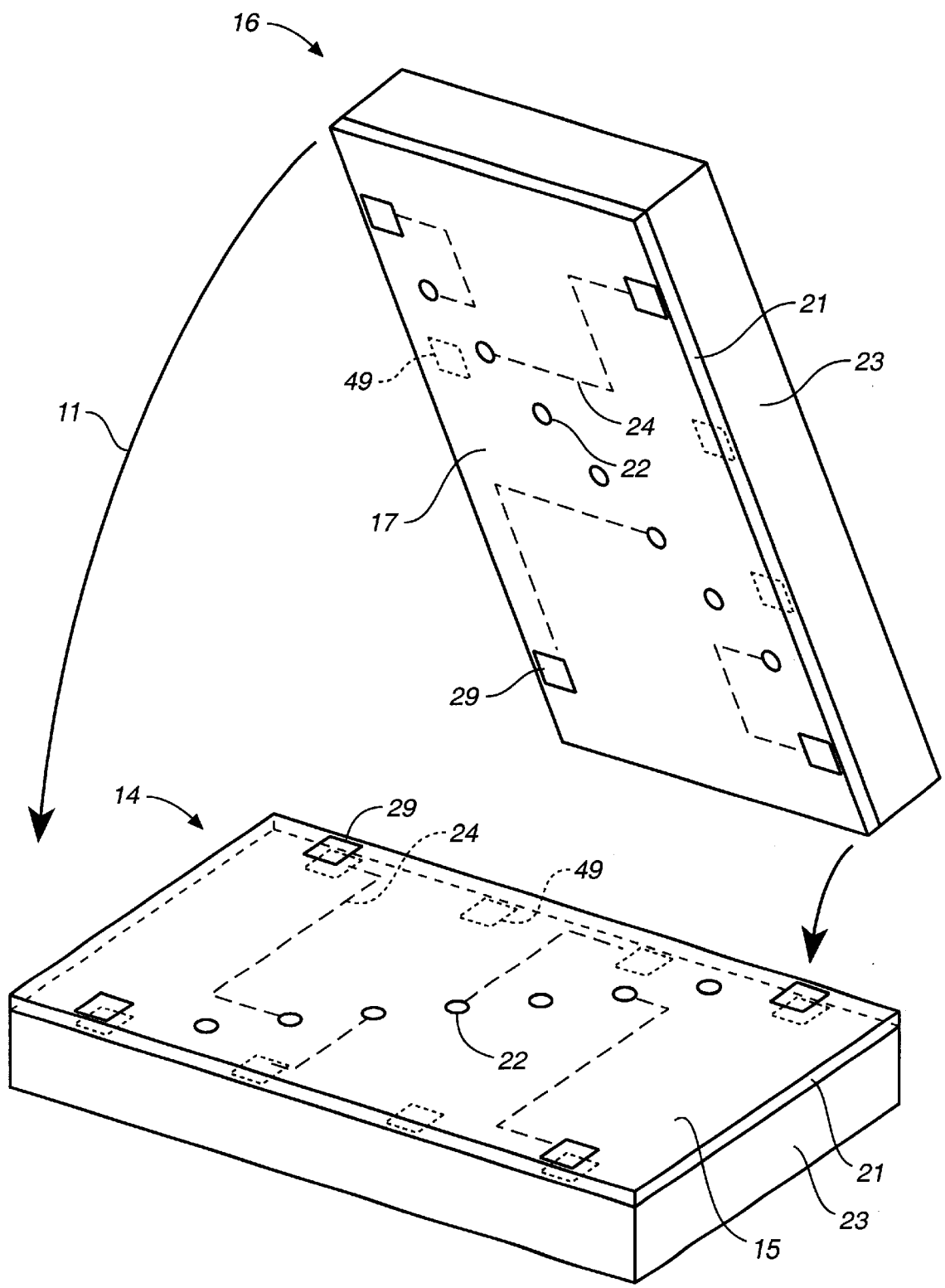
FIG._2

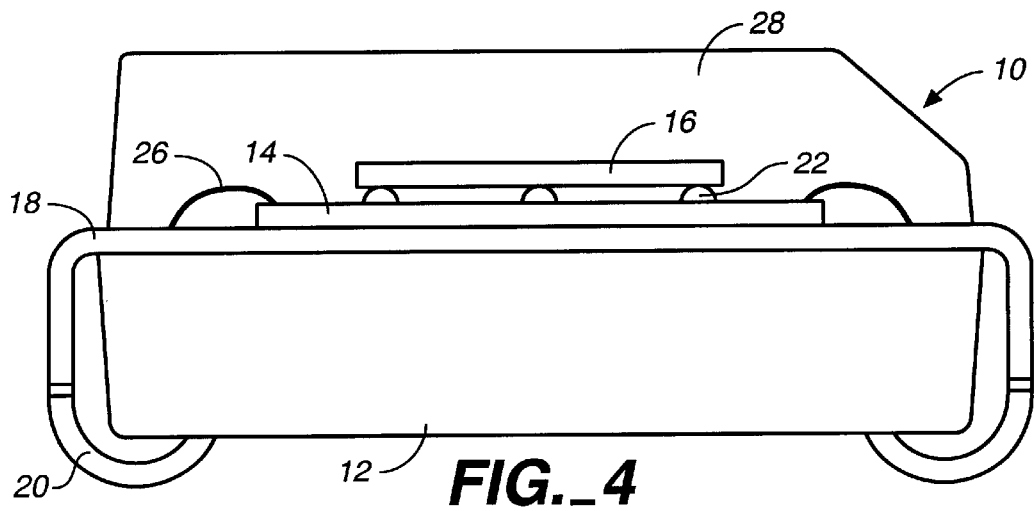
FIG._4
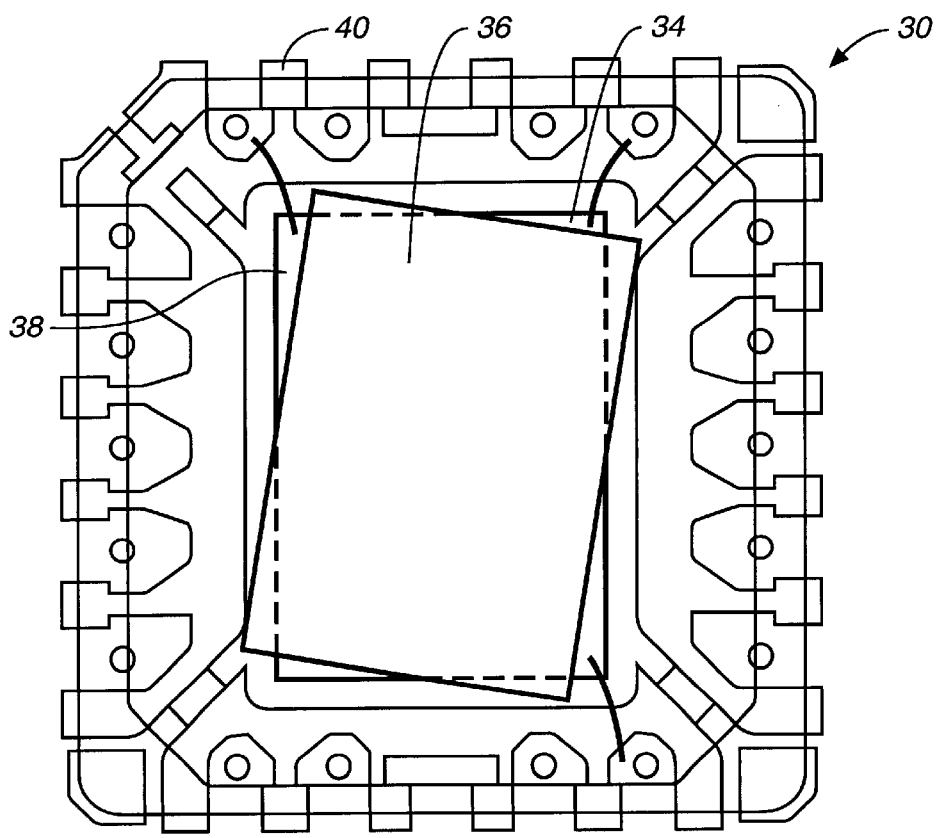
FIG._5

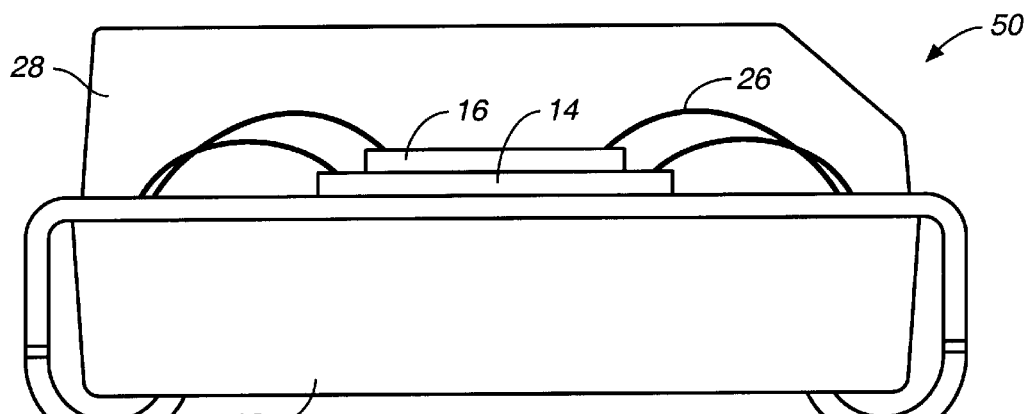
FIG._6
(PRIOR ART)
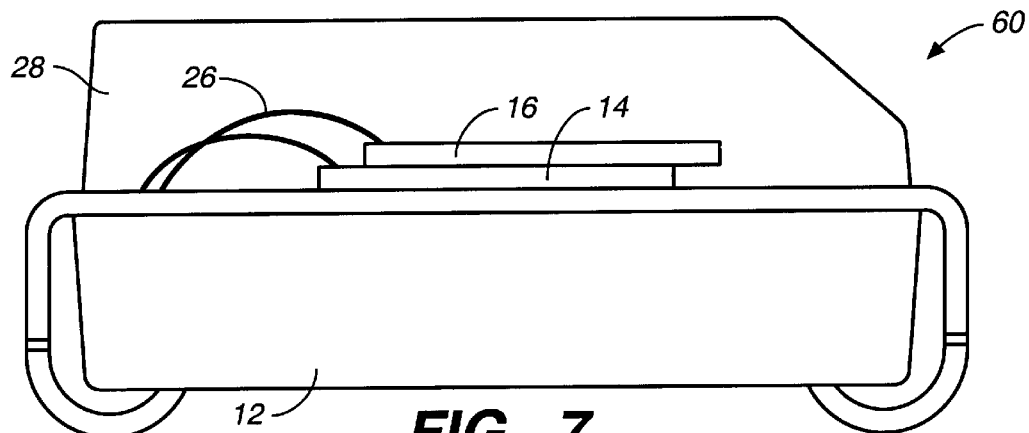
FIG._7
(PRIOR ART)
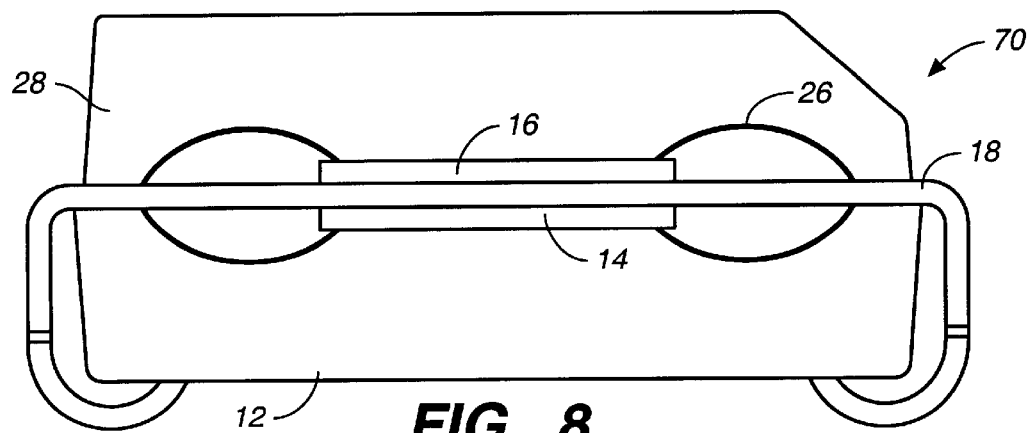
FIG._8
(PRIOR ART)

DUAL-DIE INTEGRATED CIRCUIT PACKAGE

TECHNICAL FIELD

This invention relates to integrated circuit packages and more particularly to integrated circuit packages having multiple semiconductor chips (dies).

BACKGROUND ART

A chip package is used to protect integrated circuit chips from contamination and abuse and is used to provide a durable and substantial electrical lead system for connecting integrated circuit chips onto an external printed circuit board or directly into a electronic product. There are numerous advantages to providing a multi-chip integrated circuit (IC) package over single-chip carriers. By placing multiple chips directly on a substrate that provides low-inductance and low-capacitance connections between the chips and the signal/power lines, and that supplies a very dense interconnection network, packaging density and system performance can be improved. The multi-chip package minimizes the chip-to-chip spacing and reduces the inductive and capacitive discontinuities between the chips mounted on the substrate by replacing the die-wirebond-pin-board-pin-wirebond-die path with a much superior die-bump-interconnect-bump-die path. Additionally, narrower and shorter wires on the ceramic substrate have much less capacitance and inductance than the printed circuit board interconnections. It is often advantageous to stack multiple identical IC chips into the same chip package in order to increase memory without using valuable space on the printed circuit board.

With reference to FIG. 6, in the prior art, one of the common methods of combining IC chips into a single package is to use a stacked die IC package 50 in which the top IC chip 16 is smaller than the bottom IC chip 14 in order to allow access on the bottom IC chip 14 for wirebonding leads 26. If the two IC chips are the same size, as in the stacked IC die package 60 of FIG. 7, then the top IC chip 16 must be offset from the bottom IC chip 14 in order to allow wirebonding access to the bottom IC chip 14. This limits access for the wirebonding leads 26 to one or two sides of the package, which is frequently not practical for assembly. Another common method of combining IC chips of the same size, that is known in the prior art, involves placing one of the IC chips underneath the leadframe in a package, as shown in FIG. 8. In the IC package 70 of FIG. 8, the top IC chip 16 is stacked on top of the leadframe 18 of the chip package while the bottom IC chip 14 is attached underneath the leadframe 18. The disadvantage to the die-underneath method of FIG. 8 is that the chips must be mirror images of each other, thereby requiring two complete IC fabrication steps.

U.S. Pat. No. 5,399,898 to Rostoker discloses multi-chip, multi-tier semiconductor package arrangements based upon single and double-sided flip chips. These arrangements are based on a stacked structure similar to FIGS. 6 and 7 noted above. U.S. Pat. No. 5,656,553 to Leas et al. discloses a fabrication method and resultant monolithic module comprising a plurality of stacked planar extending arrays of integrated circuit chips. The stacked die arrangement shown in the '553 patent uses edge connections to connect the upper die to the lower die. While this method of stacking multiple IC die addresses the case where two identical die are stacked, the method does not allow for routing flexibility, as the circuit routing is vertical from top to bottom and if there is any crossover, the chip package will not operate properly.

It is the object of the present invention to provide a multi-chip IC package having two or more similar semiconductor IC chips.

It is a further object of the invention to provide a multi-chip IC package having two or more similar IC chips that does not limit wirebonding to one side of the chip and does not require two complete IC fabrication steps.

It is still a further object of the invention to provide a multi-chip IC package that allows for flexibility in circuit routing.

SUMMARY OF THE INVENTION

The above objects have been met by a dual-die integrated circuit package having two chips (dies) which can be identically constructed from a wafer fabrication processing standpoint and are "flip chip" attached to each other using standard solder bumping and solder reflow technology. The first chip is aligned at a specified angle in relation to the second chip such that at least one of the bonding pads on the surface of each of the chips remain exposed for connection into a standard chip package. In one embodiment of the invention, two rectangular chips are aligned such that one chip is rotated at an angle of 90 degrees in relation to the other chip, such that the non-overlapping surfaces are exposed to enable chip package assembly. In another embodiment of the invention, the chips are aligned at an angle of less than 90 degrees such that at least a small portion, such as a corner, of each chip is exposed for chip package assembly. This embodiment would be preferable for the case when the two chips are of a square shape. In another embodiment of the invention, the two chips are of different sizes, as a larger chip is arranged on top of a smaller chip and is rotated at an angle such that the lower chip has at least some minimum area accessible for assembly. This ability to mount a larger IC chip over a smaller IC chip would be valuable to an IC manufacturer who controls the design of the smaller die, but purchases the larger die from another source.

The present invention allows for doubling the functionality or memory of a chip package while using the same package footprint as a single chip and using only one IC design. The integrated circuit package of the present invention allows for flexibility in wirebonding and routing and can be implemented in a single IC fabrication step. The present invention allows IC manufacturers to develop products with double the memory or functionality in a much faster time frame by providing the ability to use multiple identical chips in the same package without having to make significant design changes to the chips.

BRIEF DESCRIPTION OF THE DRAWINGS

FIG. 1 is a top view of a first embodiment of the dual-die integrated circuit package of the present invention, with the encapsulant material removed.

FIG. 2 is a perspective view of the two chips showing the interconnection between the two chips.

FIG. 3 is a top view of the dual-die integrated circuit package of FIG. 1 showing the two chips being attached to a leadframe.

FIG. 4 is a side view of the dual-die integrated circuit package of FIG. 1.

FIG. 5 is a top view of a second embodiment of the dual-die integrated circuit package of the present invention, with the encapsulant material removed.

FIG. 6 is a side view of a first stacked die IC package, as known in the prior art.

FIG. 7 is a side view of a second stacked die IC package, as known in the prior art.

FIG. 8 is a side view of a die-underneath IC package, as known in the prior art.

BEST MODE FOR CARRYING OUT THE INVENTION

With reference to FIG. 1, a first embodiment of the integrated circuit (IC) package 10 of the present invention is shown to include a top IC chip 16 and a bottom IC chip 14 which are aligned in a 90 degree relation with respect to each other. The chips 14, 16 are arranged on a flat die-attachment surface 12 of a leadframe 18. The leadframe 18 is made of a single piece of metal and extends from the die-attachment surface 12 to a plurality of outer leads 20 that are arranged around the perimeter of the IC package 10 and which extend downward for use in mounting the IC package 10 to an external printed circuit board.

With reference to FIG. 2, the top IC chip 16 is mechanically and electrically connected to the bottom IC chip 14 using a "flip chip" method with standard solder bumping and solder reflow technology. The connections between the chips 16 and 14 are made by solder bumps 22 on each of the chips which can be arranged in a diagonal or in an "x" pattern. The solder bumps 22 can be made as part of the original fabrication process or can be added afterwards using redistribution of electrical traces. FIG. 2 illustrates the case where the process of redistribution is used. On the original fabricated chip layer 23 of each of the chips 14 and 16, there are a plurality of bonding pads 49, shown in dashed lines, arranged around the perimeter of the chips. In FIG. 2, the bonding pads 49 are arranged on the bottom side 17 of the top chip 16 and on the top side 15 of the bottom chip 14. The bonding pads 49 are electrical terminals used for connecting the chips 14, 16 into a chip package. Each of the bonding pads 49 correspond to a particular circuit in the chip, such as power input, ground, memory address, etc. In order to carry out the redistribution process, first, a series of solder pads 22 are arranged in a diagonal pattern on the surface of the chip layer 23. If only a few connections are required, it is preferable that the solder bumps be made at the corners of the chips in order to minimize the number of solder bumps in the middle part of a chip, since that is where the memory array and other sensitive circuitry are located.

Next, routing traces 24 are then provided on the surface of each of the chips 14, 16 in order to connect the circuitry from the bonding pads 49 to the solder bumps 22. Circuits that are common to both chips 14, 16, such as ground, power input, and the clock signal for example, would be routed on each chip from the particular bonding pad corresponding to that circuit to a particular solder bump on each chip, the particular solder bumps on each chip being aligned together for interconnection. Circuits that are not common to each chip, such as chip enable for example, would not be routed to this solder bumps. The solder bumps 22 can also function as jumpers in order to connect circuits on the bottom chip 14 with circuits on the top chip 16 when the two chips are attached. Other routing traces may be added on the surface of the chip in order to connect the solder bumps with particular bonding pads which will be used for connecting the chips into the chip package. Then, a new passivation layer 21 is provided over the surfaces 15, 17 of the chips 14, 16 and the solder bumps 22 are brought through the passivation layer 21 to be exposed for interconnection. Some of the wire bonding pads 49, are also brought through the passivation layer 21, and will constitute the exposed bonding pads 29 used for connection of the chip into the chip package.

The two chips 14, 16 are then aligned at a 90 degree angle such that the solder bumps 22 are lined up for interconnection when the top chip 16 is flipped over on top of the bottom chip 14, as shown by the arrow 11. Generally, it is usually preferable to interconnect the two chips 14, 16 before placing the chips on the die-attachment surface of the chip package. This is because the melting temperature needed to reflow the solder bumps between the chips is generally higher than the temperature needed to attach the chips to the die-attachment surface. Therefore, if the bottom chip were attached to the die-attachment surface first, that attachment might become compromised when the higher temperature required to attach the top chip to the bottom chip is applied to the package. Other methods of connecting the two chips together can include the use of anisotropic ("Z-axis") epoxy or other conductive solder metalizations.

With reference to FIG. 3, the bottom chip 14 of the attached chips is secured to the die-attachment surface 12 of the leadframe by an epoxy material. Because the two rectangular IC chips 14 and 16 are aligned at a 90 degree angle with respect to each other, the exposed bonding pads 29 on the bottom chip 14 are accessible for wirebond attachment into the chip package 10. Wire bonding leads 26 are used to attach the exposed bonding pads 29 to the inner leads 19 of the leadframe. The inner leads 19 extend outward to form the outer leads 20 which are used to provide connection to other external circuits which provide the power and other input and output signals to the chip package 10.

With reference to FIG. 4, the die-attachment surface 12 of the leadframe 18 supports the bottom IC chip 14 which is wirebonded 26 to the leadframe 18 and leads 20. The top IC chip 16 is connected by the solder bumps 22 to the bottom IC chip 14. Because the chips are rotated 90 degrees with respect to one another the portion on either end of the bottom IC chip is exposed for connection of the wirebond leads 26. An encapsulant material 28 is then used to cover the top of the IC package 10, including the two chips 14, 16 and the top of the die attachment surface 12, such that the leads 20 of the leadframe 18 remain at least partially exposed. In FIG. 4, the encapsulant material 28 has been cut away so that the interior of the IC package 10 can be viewed, but in the production of the chip package the encapsulant material 28 would completely cover the chips 14, 16. The encapsulant material 28 is preferably an epoxy overcoat or plastic molding.

With reference to FIG. 5, another embodiment of the present invention is shown. The IC chip package 30 of the second embodiment shows the top IC chip 36 being aligned with the bottom IC chip 34 at an angle of less than 90 degrees. This configuration is useful for IC chips that are square, but can also be used for rectangular chips. By aligning the top IC chip 36 at an offset angle from the bottom IC chip 34, an area 38 on the bottom chip 34 is exposed for wirebonding of the chip 34 to the leads 40.

The present invention can also be implemented with two chips of differing sizes. In another embodiment similar to that shown in FIG. 5, the top IC chip 36 would be larger than the bottom IC chip. Because the top IC chip 36 is restated in relation to the bottom IC chip 34, even though the larger IC chip 36 is on top, the bottom chip 34 still has an area 38 exposed to allow accessibility for wirebonding. This would be valuable to a manufacturer who controls the design of the smaller IC chip but purchases the larger IC chip from a second source.

Although the dual-die IC package of the present invention has been described above in terms of being a PLCC (Plastic Leadless Chip Carrier) type of package, the dual-die IC chip package of the present invention can also be implemented with other types of package designs known in the art, such as ball grid arrays which use solder bumps on the bottom of the package rather than leads in order to connect the chip package to a printed circuit board. In the case of a ball grid array package and other types of package designs, the method of constructing the chip package is the same as described above, except for the particular manner in which the electrical connections are made between the chip package and an external circuit. The dual-die IC package of the present invention can also be a thin package type, such as a flat pack, or small outline IC (SOIC), by using the same construction techniques described above.

What is claimed is:

1. A dual-die integrated circuit package comprising:
    a flat die-attachment surface having a plurality of external electrical contacts for connecting the package to external circuits,
    a first IC chip having a first surface and a second surface, and having a plurality of bonding pads on the first surface, the second surface being mounted on the die-attachment surface,
    a second IC chip having a first surface and a second surface, and being mechanically and electrically connected by its second surface to the first surface of the first IC chip, wherein the second IC chip is aligned at a specified angle in skewed relation to the first IC chip in a covering relation, said specified angle being greater than 45 degrees and less than ninety degrees with bonding pads on the first surface of the first IC chip remaining uncovered and electrically connected to the external electrical contacts of the die-attachment surface, and
    an encapsulant material enclosing the first and second IC chip and covering a portion of the die-attachment surface such that the plurality of electrical contacts remain at least partially uncovered.

2. The integrated circuit package of claim 1, wherein the first and second IC chips are of a same size.

3. The integrated circuit package of claim 1, wherein first and second IC chips have a rectangular shape.

4. The integrated circuit package of claim 1, wherein the second surface of the second IC chip and the first surface of the first IC chip include a series of solder bumps to enable electrical and mechanical connection between the second IC chip and the first IC chip.

5. The integrated circuit package of claim 1, wherein the die-attachment surface is a part of a leadframe, with a plurality of leads being disposed on a perimeter of the die-attachment surface.

6. The integrated circuit package of claim 5, wherein the plurality of leads are electrically connected to the first and second IC chips by wirebond connection between the leads and the plurality of bonding pads on the first surface of the first IC chip.

7. The integrated circuit package of claim 1, wherein the first IC chip is mounted to the die-attachment surface by epoxy.

8. The integrated circuit package of claim 1, wherein the second IC chip is larger than the first IC chip and is mounted on top of the first IC chip.

9. The integrated circuit package of claim 1, wherein the die-attachment surface is a part of a ball grid array type structure and includes a series of solder bumps on a bottom surface of the chip package.

10. The integrated circuit package of claim 4, wherein the series of solder bumps are arranged in a diagonal pattern.

11. The integrated circuit package of claim 4, wherein the series of solder bumps are arranged in a "X-shaped" pattern.

12. A dual-die integrated circuit package comprising:
    a flat die-attachment surface with a plurality of electrical contacts disposed thereon,
    a first IC chip having a first surface and a second surface wherein a plurality of bonding pads are arranged on the first surface and wherein the second surface is mounted onto the die-attachment surface,
    a second IC chip having a first surface and a second surface,
    wherein the second IC chip is larger than the first IC chip and is mounted on top of the first IC chip, wherein the second surface of the second IC chip and the first surface of the first IC chip include a series of solder bumps, the series of solder bumps being connected by solder bumping and reflow to electrically and mechanically couple the first IC chip and the second IC chip, and wherein the second IC chip is aligned at a specified angle in skewed relation to the first IC chip leaving a plurality of bonding pads on the first surface of the first IC chip uncovered,
    means for electrically coupling the plurality of electrical contacts on the die-attachment surface and the plurality of bonding pads on the first surface of the first IC chip, and
    an encapsulant material enclosing the first and second IC chips and covering a portion of the die-attachment surface such that the plurality of electrical contacts remain at least partially exposed.

13. The integrated circuit package of claim 12, wherein the die-attachment surface constitutes a part of a leadframe, with a plurality of leads being disposed on a perimeter of the die-attachment surface.

14. A method of forming a dual-die integrated circuit package comprising:
    arranging a plurality of solder bumps on a first surface of a first IC chip and on a first surface of a second IC chip, the first and second IC chips having a plurality of bonding traces arranged thereon,
    arranging a series of routing traces on the first surfaces of the first and second IC chips, the routing traces interconnecting the solder bumps and the bonding pads,
    adding a passivation layer over the first surfaces of each of the first and second chips, the solder bumps and the bonding pads remaining exposed through the passivation layer,
    aligning the second chip at a specified angle in skewed relation to the first chip, said angle being greater than zero degrees and less than 45 degrees,
    connecting the second chip to the first chip through the solder reflow attachment of the solder bumps of each of the chips,
    attaching the first chip to a flat die-attachment surface being in mechanical and electrical communication with a plurality of electrical contacts, and
    covering the first and second chips and an inner part of the die-attachment surface with an encapsulant material.

15. The method of forming a dual-die integrated circuit package, as in claim 14, wherein the step of connecting the second chip to the first chip is carried out by using an anisotropic epoxy.

16. A dual-die integrated circuit package comprising:
    a flat die-attachment surface having a plurality of external electrical contacts for connecting the package to external circuits, a first IC chip having a first surface and a second surface, and having a plurality of bonding pads on the first surface, the second surface being mounted on the die-attachment surface, a second IC chip having a first surface and a second surface, and being mechanically and electrically connected by its second surface to the first surface of the first IC chip, wherein the second IC chip is aligned at a specified angle in skewed relation to the first IC chip in a covering relation, said specified angle being greater than zero degrees and less than 45 degrees, with bonding pads on the first surface of the first IC chip remaining uncovered and electrically connected to the external electrical contacts of the die-attachment surface, and an encapsulant material enclosing the first and second IC chip and covering a portion of the die-attachment surface such that the plurality of electrical contacts remain at least partially uncovered.

17. The integrated circuit package of claim 16, wherein the first and second IC chips are of a same size.

18. The integrated circuit package of claim 1, wherein the first and second IC chips have a rectangular shape.

19. The integrated circuit package of claim 16, wherein the second surface of the second IC chip and the first surface of the first IC chip include a series of solder bumps to enable electrical and mechanical connection between the second IC chip and the first IC chip.

20. The integrated circuit package of claim 16, wherein the second IC chip is larger than the first IC chip and is mounted on top of the first IC chip.

21. The integrated circuit package of claim 19, wherein the series of solder bumps are arranged in a diagonal pattern.

22. The integrated circuit package of claim 19, wherein the series of solder bumps are arranged in a "X-shaped" pattern.

23. A method of forming a dual-die integrated circuit package comprising:

arranging a plurality of solder bumps on a first surface of a first IC chip and on a first surface of a second IC chip, the first and second IC chips having a plurality of bonding traces arranged thereon, arranging a series of routing traces on the first surfaces of the first and second IC chips, the routing traces interconnecting the solder bumps and the bonding pads, adding a passivation layer over the first surfaces of each of the first and second chips, the solder bumps and the bonding pads remaining exposed through the passivation layer, aligning the second chip at a specified angle in skewed relation to the first chip, said angle being greater than 45 degrees and less than 90 degrees, connecting the second chip to the first chip through the solder reflow attachment of the solder bumps of each of the chips, attaching the first chip to a flat die-attachment surface being in mechanical and electrical communication with a plurality of electrical contacts, and covering the first and second chips and an inner part of the die-attachment surface with an encapsulant material.

* * * * *

UNITED STATES PATENT AND TRADEMARK OFFICE
CERTIFICATE OF CORRECTION

PATENT NO.   : 6,376,914 B2
DATED        : April 23, 2002
INVENTOR(S)  : Julius A. Kovats et al.

It is certified that error appears in the above-identified patent and that said Letters Patent is hereby corrected as shown below:

<u>Title page,</u>
Item [57], ABSTRACT,
Line 1, "A diual-die integrated circuit package having two integrated" should read
-- A dual-die integrated circuit package having two integrated --.

Signed and Sealed this

Twenty-seventh Day of August, 2002

*Attest:*

*Attesting Officer*

JAMES E. ROGAN
*Director of the United States Patent and Trademark Office*